(12) United States Patent
Hao

(10) Patent No.: US 6,922,867 B1
(45) Date of Patent: Aug. 2, 2005

(54) TWO POSITION ROBOT DESIGN FOR FOUP PURGE

(75) Inventor: Fangli Hao, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 242 days.

(21) Appl. No.: 10/210,573

(22) Filed: Jul. 31, 2002

Related U.S. Application Data

(60) Provisional application No. 60/311,047, filed on Aug. 8, 2001.

(51) Int. Cl.⁷ ................................................. A47L 5/14
(52) U.S. Cl. ........................ 15/318; 15/316.1; 15/312.1
(58) Field of Search ............................... 15/405, 316.1, 15/318, 312.1, 312.2, 314

(56) References Cited

U.S. PATENT DOCUMENTS

| | | | | |
|---|---|---|---|---|
| 3,304,570 A | * | 2/1967 | Seress et al. ............... | 15/312.1 |
| 4,655,258 A | * | 4/1987 | Breyer et al. ............... | 15/312.2 |
| 4,864,679 A | * | 9/1989 | Briner ......................... | 15/312.2 |
| 4,869,296 A | * | 9/1989 | Shaw .......................... | 15/312.2 |
| 5,594,973 A | * | 1/1997 | Brusseleers et al. ........ | 15/312.1 |
| 2004/0152322 A1 | * | 8/2004 | Tokunaga .................... | 438/689 |
| 2004/0168742 A1 | * | 9/2004 | Kim et al. .................... | 141/98 |
| 2004/0182472 A1 | * | 9/2004 | Aggarwal ..................... | 141/98 |
| 2004/0250519 A1 | * | 12/2004 | Wu et al. .................... | 55/385.2 |

* cited by examiner

*Primary Examiner*—Theresa T. Snider
(74) *Attorney, Agent, or Firm*—IP Strategy Group, P.C.

(57) ABSTRACT

This invention is an apparatus for purging unwanted gasses from the Front Opening Unified Pod (FOUP). It consists of a purging wand which is inserted into the chamber for an optimal purge. The purging wand moves back and forth along a simple axis activated by a linkage robot. The wand is carried along a track with the FOUP and when its reaches its optimal position inside the FOUP, the source of cleaning gas is allowed to flow into and spray out of the wand thereby purging the FOUP. After the purging is completed, the linkage robot withdraws the wand from within the FOUP to its original position.

20 Claims, 6 Drawing Sheets

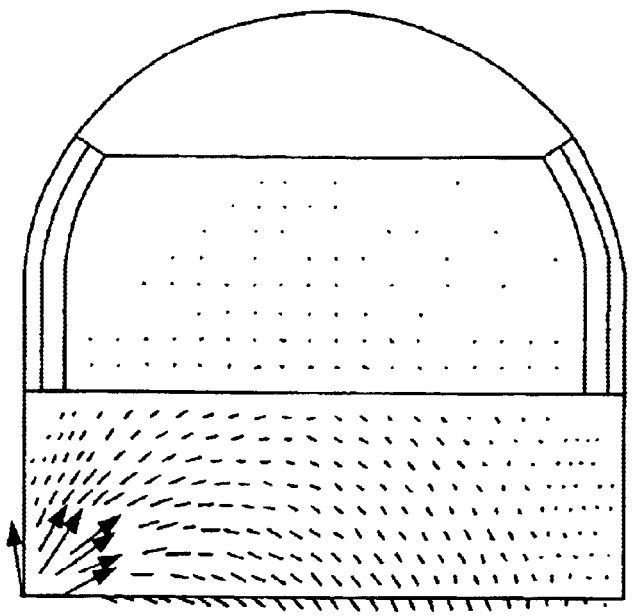
FIGURE 1. FLOW PATTERN: NOZZLES ARE OUTSIDE THE FOUP EDGE
(PRIOR ART)
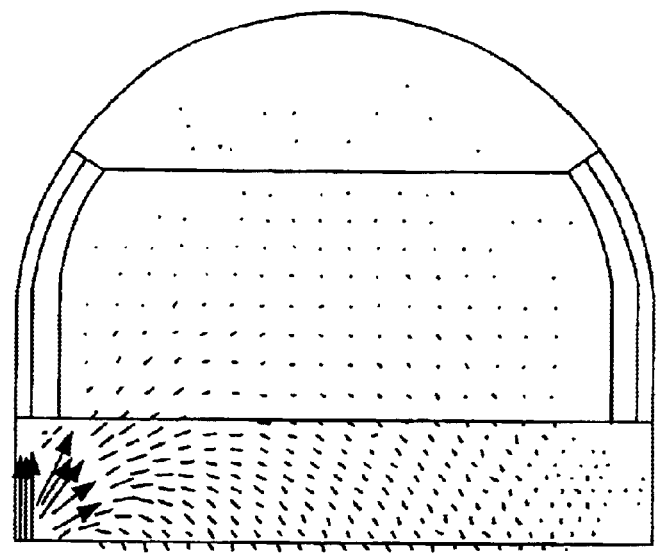
FIGURE 2. FLOW PATTERN: NOZZLES ARE 2" INSIDE FROM THE FOUP EDGE
(PRIOR ART)

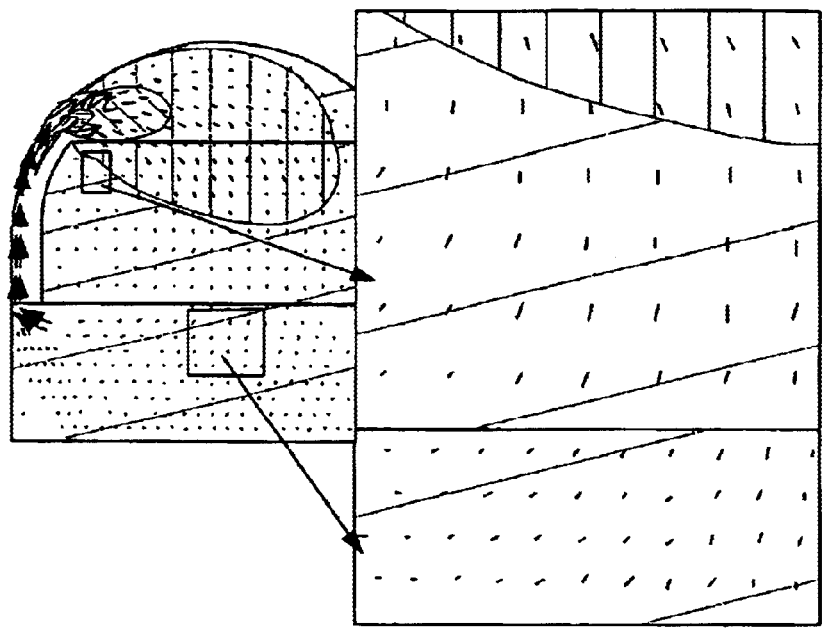
FIGURE 3. FLOW PATTERN: NOZZLES ARE 4" INSIDE FROM FOUP EDGE (PRIOR ART)
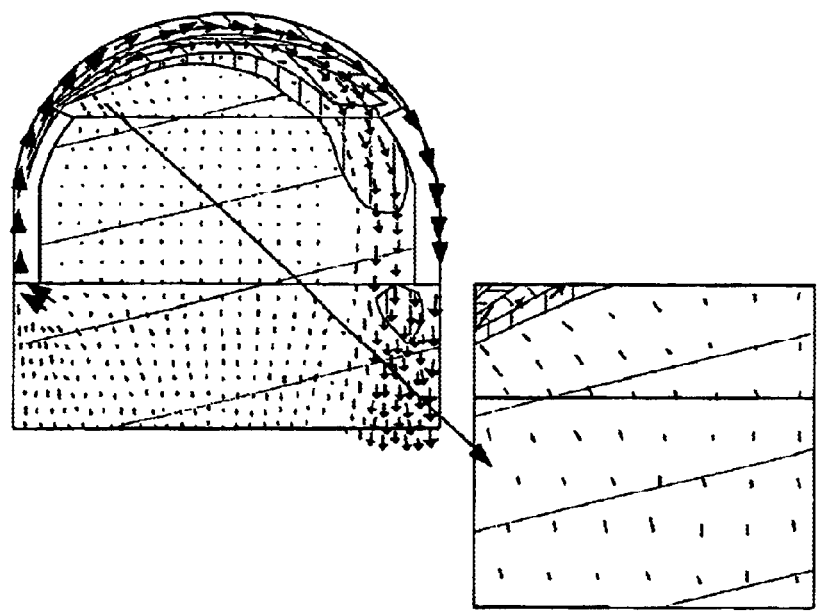
FIGURE 4. FLOW PATTERN: NOZZLES ARE 4" INSIDE FROM THE FOUP EDGE, HIGH MASS FLOW RATE (PRIOR ART)

TWO POSITION ROBOT DESIGN FOR FOUP PURGE

CROSS REFERENCE TO RELATED APPLICATION

This application claims of U.S. Provisional patent application Ser. No. 60/311,047 filed Aug. 8, 2001.

BACKGROUND OF THE INVENTION

The present invention relates to the manufacture of semiconductor devices. More particularly, the present invention relates to the reduction of post etch gasses or byproducts in the Front Opening Unified Pod (FOUP) of a semiconductor cluster tool.

Semiconductor process tools often post-etched wafers with pre-etched wafers in the Front Opening Unified Pod (FOUP). These wafers are not under vacuum, but are exposed to ambient conditions present in the wafer-fab. Typical main chamber processing chemistry involves the use of hydrogen bromide (HBr), chlorine ($Cl_2$) and other gases. Bromides absorbed on the surface of the processed wafers tend to give off gas (outgas) inside the FOUP and condense as a brominated haze on the unetched wafer surface. These brominated condensates may become an etch defect due to micromasking and may result in yield reduction. A microwave post-etch treatment can eliminate brominated cross contamination caused by the outgas of bromide etched wafers. This hazardous material can also diffuse into surrounding areas and atmosphere, causing harm to operators.

A post process $O_2$ flush can reduce the residual gasses on the wafer, however, adding the process step adversely affects wafer processing throughput by requiring additional time.

An alternative method to reduce wafer defect requires separation of processed wafers from pre-processed wafers. The approach can be achieved by adding an extra FOUP station, or locating wafers to buffer stations or other places inside the Transfer Mechanism (TM) to avoid cross contamination. However, adding an additional FOUP station increases the footprint of the tool, increasing the cost of ownership. Locating wafers to buffer stations or other places inside the TM has other issues as well. First, there are more wafers than spaces provided by the buffer or other stations. Second, relocating the wafer to alternate stations consumes time, and thus impacts wafer throughput. In addition the environmental issue of harmful gasses is not addressed by the above solutions.

One effective method practiced on 200 mm tools is to purge the FOUP with $N_2$ or clean dry air sprayed from nozzles. Due to hardware limitations, to date, only fixed nozzles have been used and these are located outside of the FOUP but inside the TM.

Flow analysis shows that the position of these nozzles are one of the primary factors on the flow patterns through the FOUP. The back-flow from the FOUP should be minimized since the back-flow most likely contains purged air and possible contaminants, since it has already circulated through the FOUP. FIG. 1 shows flow patterns when purge nozzles are located just outside of the FOUP. FIG. 2 shows flow patterns when purge nozzles are positioned 2 inches inside the FOUP. FIG. 3 shows flow patterns when purge nozzles are positioned about 4.4 inches from the door inside the FOUP. Therefore, the further inside the FOUP the purge nozzles are positioned, the more desirable the flow patterns become from a purging perspective.

Another factor which affects flow patterns is the mass flow rate. FIG. 4 shows flow patterns when the flow rate is too high. Most of the mass flows along the FOUP wall and as a result, back flow concentrates at the center of the FOUP. When mass flow rate is optimal, mass flows in through the sidewall, purges through the wafers and then flows out the ATM, which is the collection site for wasted air.

SUMMARY OF THE INVENTION

The objective of this invention is to reduce the concentration of post-etch gasses and byproducts in the FOUP and to improve upon the inherently inefficient flow patterns of fixed purging nozzles located at the front of the FOUP which create inefficient purges. To accomplish this objective, the invention is a two position robot arm which travels into the FOUP after the FOUP door is open. The robot arm houses multiple nozzles to deliver uniformly distributed $N_2$ or CDA (clean, dry air) to purge the FOUP.

BRIEF DESCRIPTION OF THE DRAWINGS

The present invention will be readily understood by the following detailed description in conjunction with the accompanying figures.

FIG. 1 illustrates a typical flow pattern for purge nozzles situated outside the FOUP.

FIG. 2 illustrates a typical flow pattern for purge nozzles situated 2 inches inside of FOUP.

FIG. 3 illustrates a typical flow pattern for purge nozzles located 4 inches inside of the FOUP.

FIG. 4 illustrates a typical flow pattern for purge nozzles located 4 inches inside of the FOUP with a high-mass flow rate.

DETAILED DESCRIPTION OF THE PREFERRED EMBODIMENTS

Figure 5:
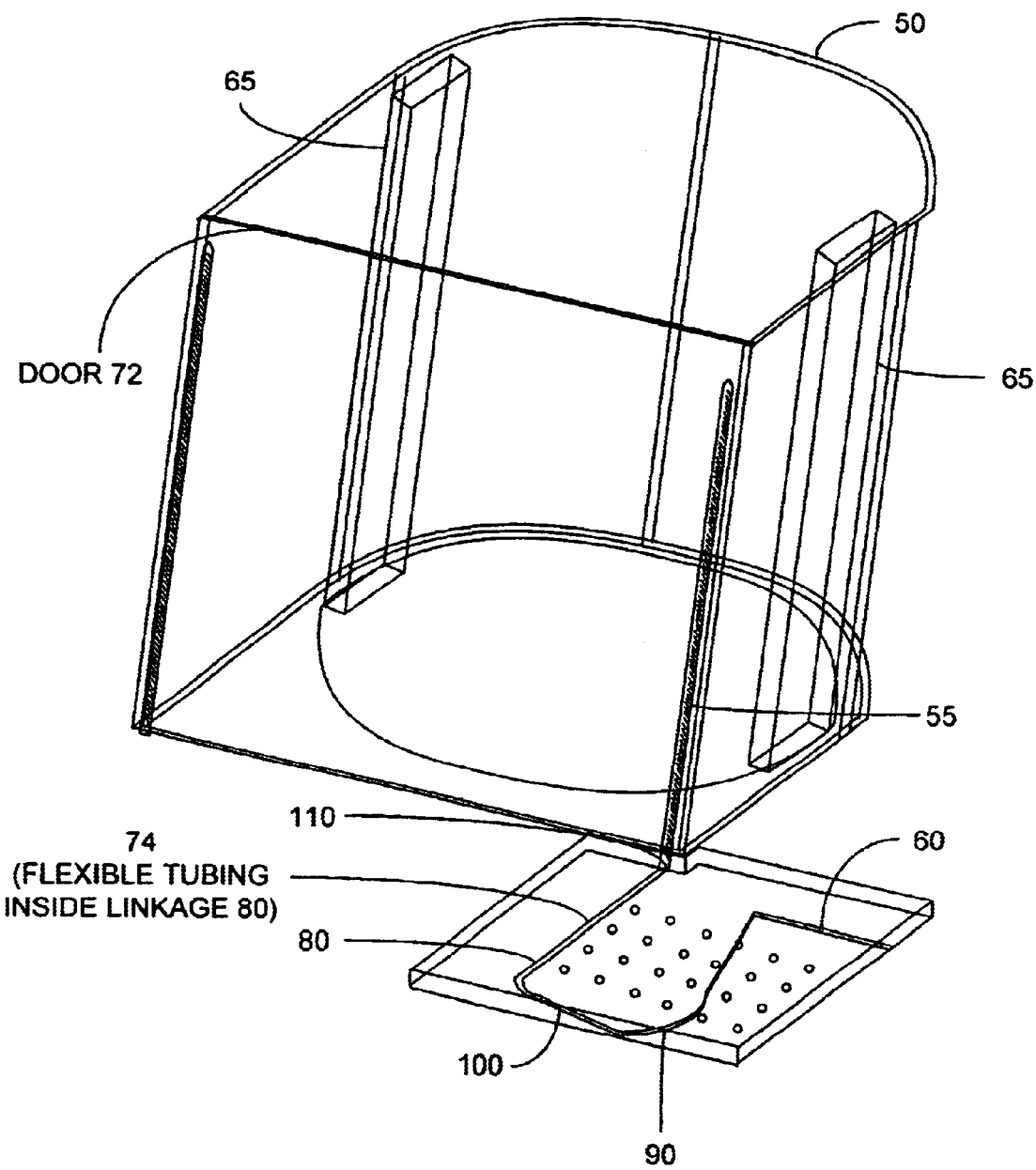
FIG. 5 shows the robot in its resting position outside the FOUP.

Referring to FIG. 5, shown is the FOUP 50. The entire purging assembly, known as the purging robot consists of actuating linkage 60, output linkage 80, coupler 1 90, and coupler 2 100, robot arm or purge wand 55, and wafer holder assembly 65. The output linkage is constrained in a slide box 110. The opening through which wafers are passed is on the front side of the FOUP has been inserted after 'FOUP'. The wand can be attached to a source CDA, N2 or other type of purging gas at the bottom of the purge wand through flexible tubing 74 contained within the linkage 80. When activated from its resting position, the wand moves along one axis into the FOUP. The FOUP contains a track or guide (not shown) to facilitate tracking of the purging wand into the FOUP. The wand is designed such that uniform flows are distributed.

Different configurations of the purging robot can be designed to achieve the two end positions. A preferred design configuration is as follows. In the rest position, as shown in FIG. 5, the actuating linkage 60 has been rotated 180 degrees clockwise from the working position. Coupler 1 90 is stretched towards the far end, and the output linkage is outside the FOUP. In the working position, the configuration, shown in FIG. 6, the input linkage 60 has been rotated 180 degrees counterclockwise from the resting position. Coupler 1 90 is shown retracted back lying parallel to the trace of the input linkage 60, and the output linkage 80 stays inside the FOUP.

Figure 6:
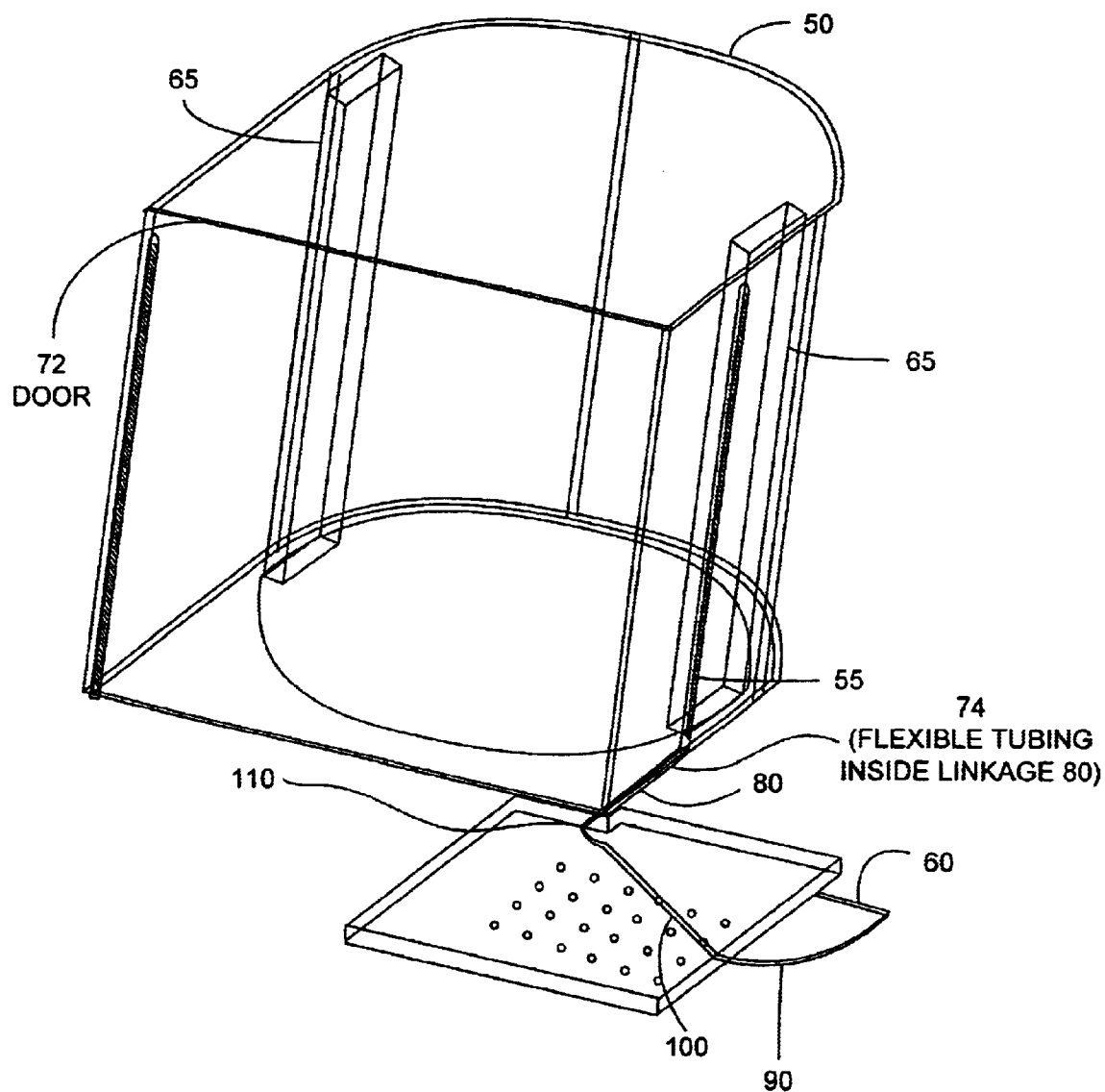
FIG. 6 shows the robot in its working configuration inside the FOUP.

Once the wand reaches its purging or working position, shown in FIG. 6, the source of CDA or N2 is initiated and this purging gas flows along the back wall of the chamber efficiently sweeping out contaminated gas with minimum contaminated gas back wash. After the purging process has been completed the valve closes and the wand retreats to the outside of the FOUP in its resting position.

Figure 7:
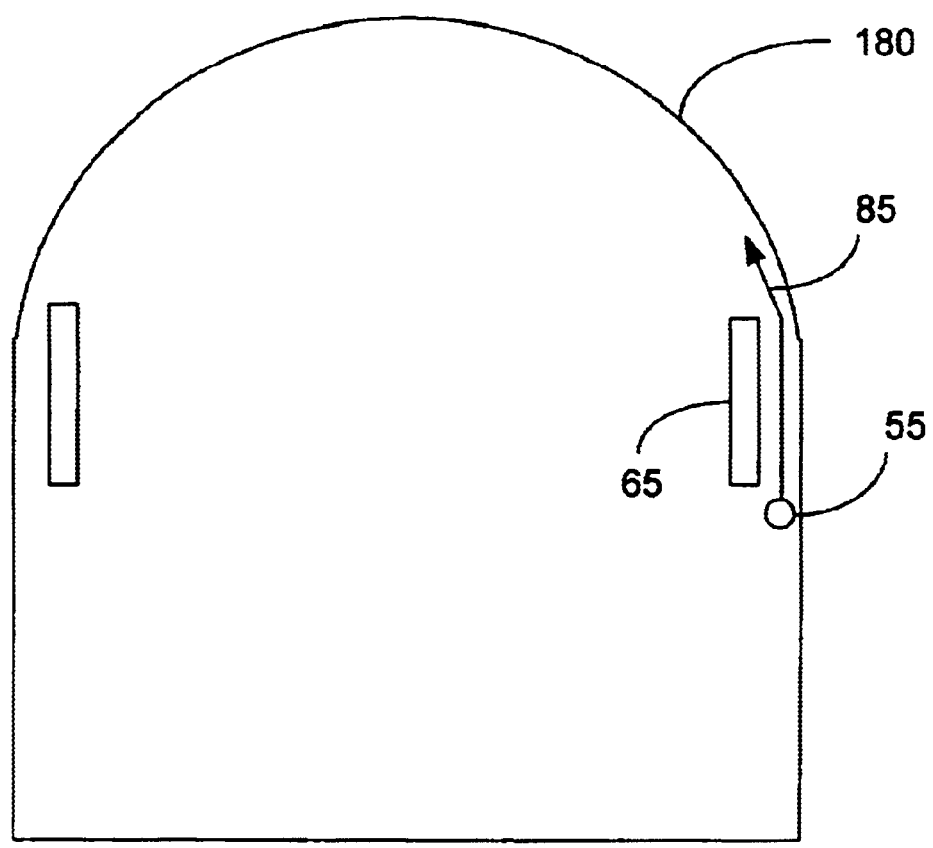
FIG. 7 shows a top view of the robot in its working configuration inside the FOUP.
Figure 8:
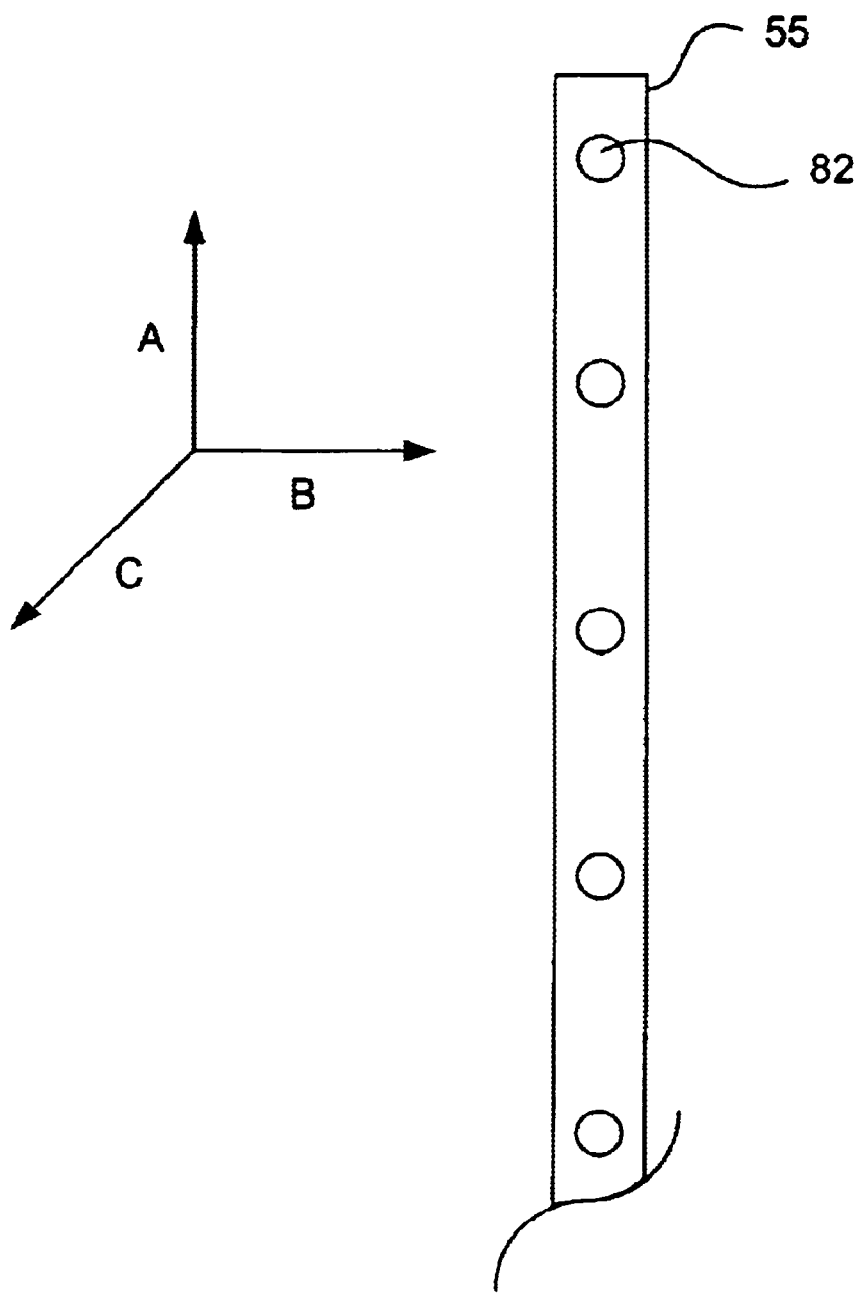
FIG. 8 shows the robot arm in greater detail, including the nozzles thereon.

Referring to FIG. 7 a top view of the FOUP assembly, shown is the purging wand 55 in the working position. The critical design consideration is that the wand 55, is positioned in its working position such that the nozzles of the wand spray the purging gas between the wafer holder assembly 65 and the back wall 180 of the FOUP. FIG. 8 shows the wand 55, including the nozzles 82 directed in the direction of axis "c" (according to the axis diagram that includes axis "a", axis "b", and axis "c") whereby axis "c" is intended to represent the direction straight out of the drawing page and is intended to illustrate the direction toward the backwall of the FOUP to direct purging sprays between the wafer holder assembly 65 and the backwall of the FOUP. This is important due to the narrow space between the wafer holder assembly and the back wall of the FOUP. Arrow 85 shows the flow direction of the purging spray.

While this invention has been described in terms of a preferred embodiment, there are alterations, permutations, and equivalents which fall within the scope of this invention. It should also be noted that there are many alternative ways of implementing the present invention. It is therefore intended that the following appended claims be interpreted as including all such alternations, permutations, and equivalents as fall within the true spirit and scope of the present invention.

What is claimed is:

1. In a semiconductor cluster tool, an arrangement to facilitate the processing of semiconductor wafers, comprising:

a front opening unified Pod (FOUP) having a front opening through which said wafers are passed, a back wall, and a wafer holder assembly;

a purging assembly for purging an interior of said FOUP with purging gas, said purging assembly including a robot arm configured to distribute said purging gas in said FOUP, said robot arm being configured to move between a resting position and a working position along an axis relative to said FOUP, said resting position being further away from said wafer holder assembly than said working position is from said wafer holder assembly, said robot arm, when disposed in said working position is configured to direct purging spray of said purging gas between said wafer holder assembly and said back wall.

2. The arrangement of claim 1 wherein said robot arm is coupled with an output linkage, said output linkage being constrained in a slide box as said robot arm is moved between said resting position and said working position.

3. The arrangement of claim 2 wherein said output linkage is disposed outside said FOUP when said robot arm is in said resting position.

4. The arrangement of claim 2 wherein said output linkage is disposed inside said FOUP when said robot arm is in said working position.

5. The arrangement of claim 2 wherein said purging gas is provided to said robot arm via flexible tubing contained within said output linkage.

6. The arrangement of claim 2 wherein said output linkage is operatively coupled with an actuating linkage via at least one coupler, said actuating linkage being configured to rotate between a first position and a second position to move said robot arm between said resting position and said working position respectively.

7. The arrangement of claim 1 wherein said purging assembly is configured to distribute clean dry air.

8. The arrangement of claim 1 wherein said purging assembly is configured to distribute N2.

9. The arrangement of claim 1 wherein has been inserted after said purging gas to flow along said back wall when said robot arm is disposed in said working position.

10. The arrangement of claim 1 wherein said FOUP includes a door, said robot arm being configured to move to said working position after said door is open.

11. In a semiconductor cluster tool having a front opening unified Pod (FOUP), said FOUP having a front opening through which wafers are passed, a back wall, and a wafer holder assembly, a method for purging an interior of said FOUP with purging gas, comprising:

providing a robot arm, said robot arm being configured to distribute said purging gas from nozzles disposed in said robot arm;

moving said robot arm between a resting position and a working position along an axis relative to said FOUP, said resting position being further away from said wafer holder assembly than said working position is from said wafer holder assembly; directing a purging spray of said purging gas between said wafer holder assembly and said back wall to purge the interior of said FOUP.

12. The method of claim 11 wherein said robot arm is coupled with an output linkage, said output linkage being constrained in a slide box as said robot arm is moved between said resting position and said working position.

13. The method of claim 12 wherein said output linkage is disposed outside said FOUP when said robot arm is in said resting position.

14. The method of claim 12 wherein said output linkage is disposed inside said FOUP when said robot arm is in said working position.

15. The method of claim 12 further comprising providing a flexible tubing within said output linkage, said flexible tubing is configured to provide said purging gas to said robot arm.

16. The method of claim 12 wherein said output linkage is operatively coupled with an actuating linkage via at least one coupler, said actuating linkage being configured to rotate between a first position and a second position to move said robot arm between said resting position and said working position respectively.

17. The method of claim 11 wherein said purging gas is clean dry air.

18. The method of claim 11 wherein said purging gas is N2.

19. The method of claim 11 wherein said purging assembly is configured to direct said purging gas to flow along said back wall when said robot arm is disposed in said working position.

20. The method of claim 11 wherein said FOUP includes a door, said robot arm being configured to move to said working position after said door is open.

* * * * *